(12) United States Patent
Nakanishi et al.

(10) Patent No.: US 6,726,376 B2
(45) Date of Patent: Apr. 27, 2004

(54) LEAD FRAME, AND SEMICONDUCTOR INTEGRATED CIRCUIT USING THE SAME, AND OPTICAL MODULE AND METHOD PRODUCING FOR THE SAME

(75) Inventors: Hiromi Nakanishi, Osaka (JP); Yoshiki Kuhara, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 58 days.

(21) Appl. No.: 10/106,124
(22) Filed: Mar. 27, 2002
(65) Prior Publication Data
US 2002/0140092 A1 Oct. 3, 2002
(30) Foreign Application Priority Data
Mar. 28, 2001 (JP) ...................... P2001-092330
(51) Int. Cl.[7] .................... G02B 6/36; H01L 23/48; H01L 21/44
(52) U.S. Cl. .............. 385/92; 385/88; 385/90; 257/734; 438/617
(58) Field of Search ............... 385/88–94; 257/678, 257/734; 438/617

(56) References Cited

U.S. PATENT DOCUMENTS 6,585,426 B2 * 7/2003 Shuto et al. ................. 385/90

FOREIGN PATENT DOCUMENTS

JP 10-154849 6/1998

* cited by examiner

*Primary Examiner*—Phan T. H. Palmer
(74) *Attorney, Agent, or Firm*—Smith, Gambrell & Russell, LLP

(57) ABSTRACT

A producing method an optical module is carried out as shown below. First, an optical-communication functional portion is disposed on a lead frame where each lead is held by an insulating connection leads. A screening test for the optical communication functional portion is performed. A product selected through a screening test process is packaged. In the above-mentioned method, the connection leads which are electrically insulated with one another and the screening test is performed before packaging or encapsulating. Consequently, the waste accompanied by discarding the component elements of the optical module, which has caused an increase in the cost, can be eliminated. Further, an attempt to reduce the cost of products can also be made.

8 Claims, 10 Drawing Sheets

PRIOR ART FIG. 7
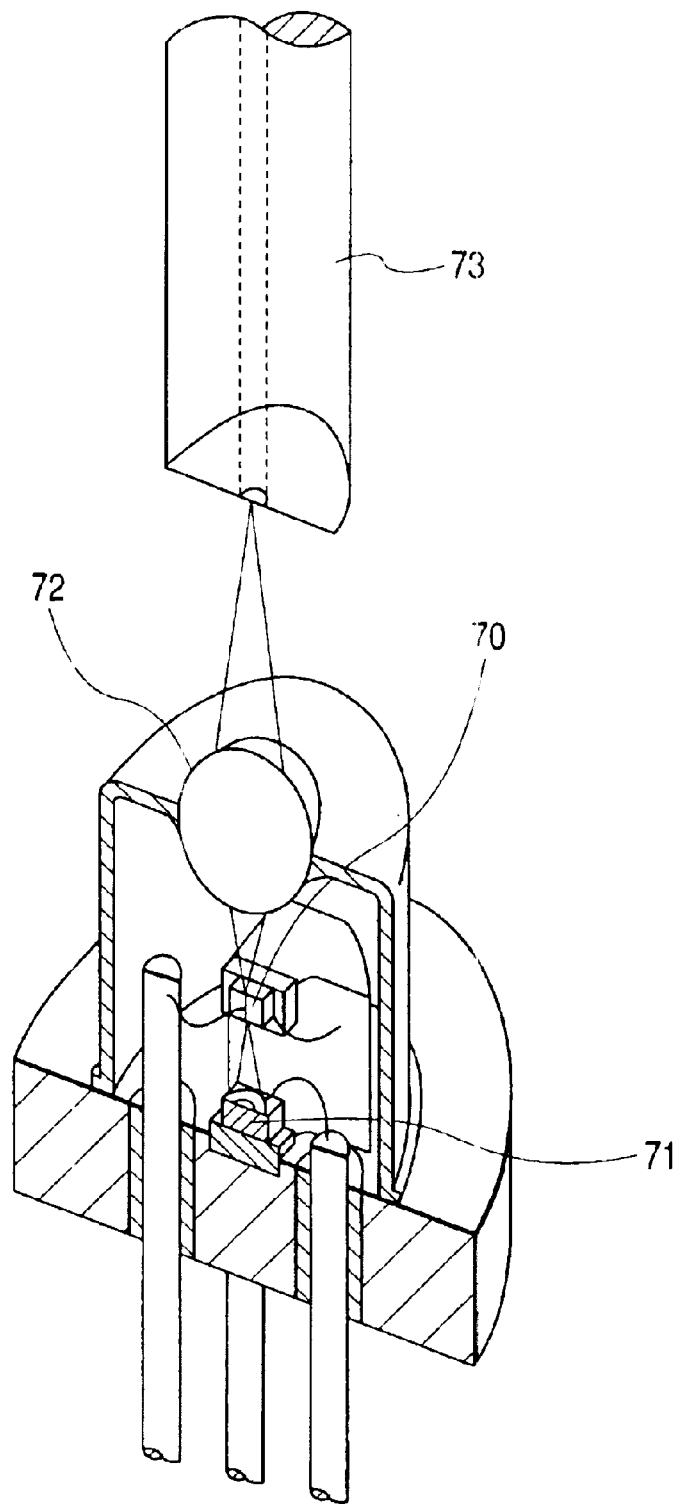

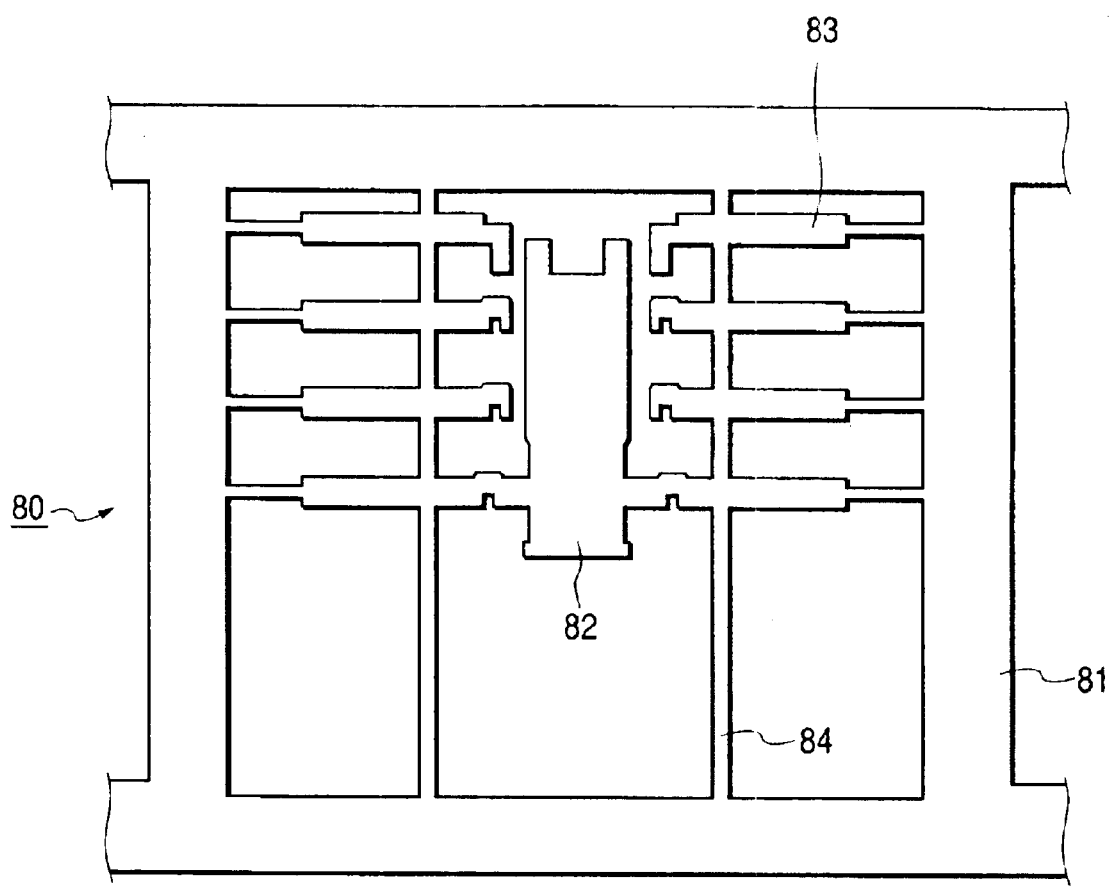
PRIOR ART    FIG. 8

PRIOR ART  *FIG. 9*
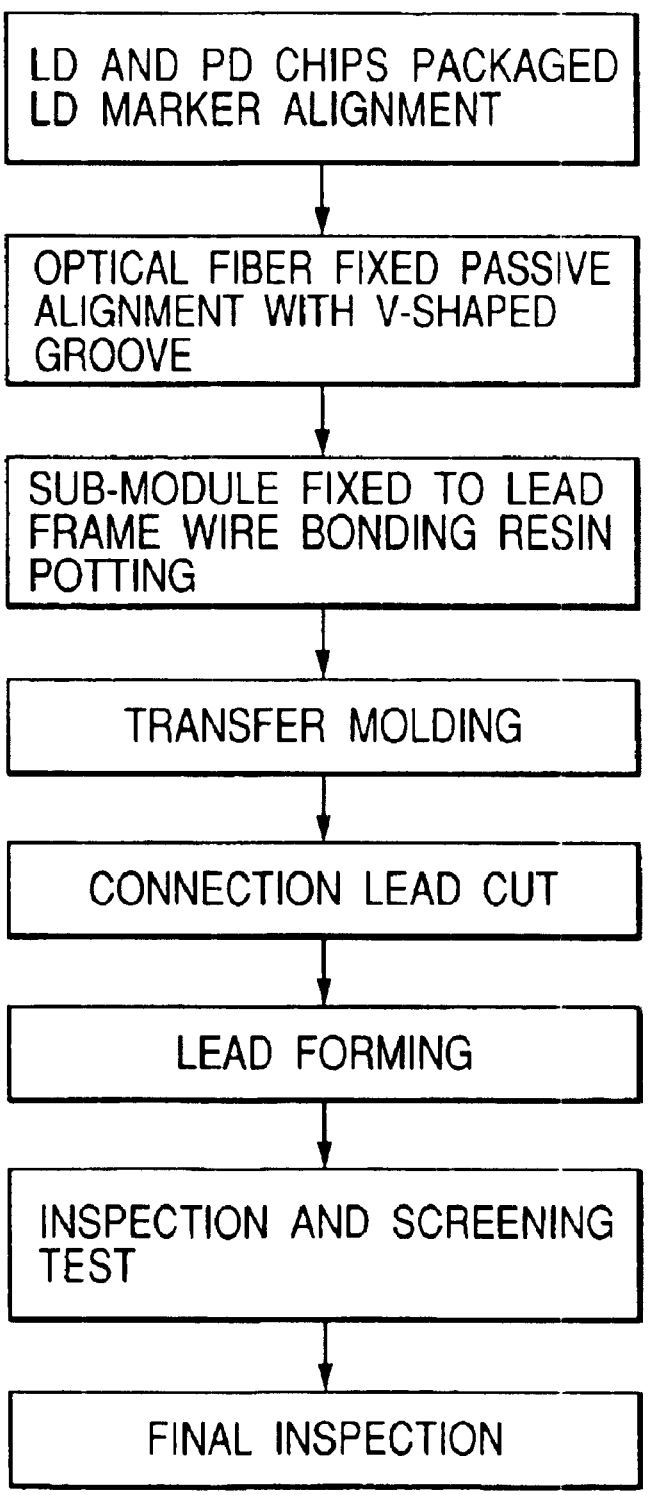

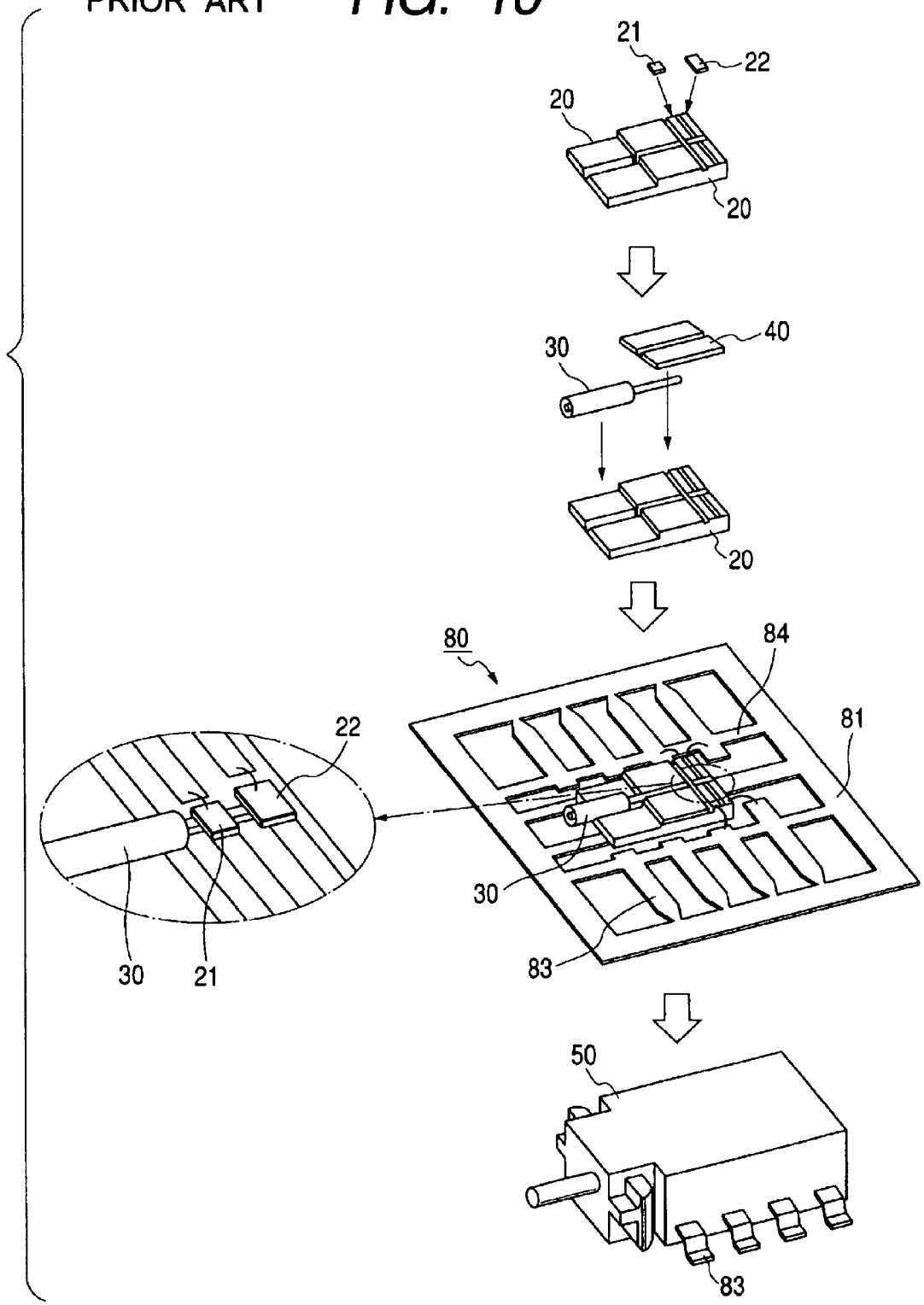
PRIOR ART  FIG. 10

LEAD FRAME, AND SEMICONDUCTOR INTEGRATED CIRCUIT USING THE SAME, AND OPTICAL MODULE AND METHOD PRODUCING FOR THE SAME

BACKGROUND OF THE INVENTION

1. Field of the Invention

The invention relates to a lead frame, and a semiconductor integrated circuit using the lead frame, and an optical module and a producing method for the optical module.

2. Description of the Ralated Art

FIG. 7 is a cutaway perspective view showing the sectional structure of a semiconductor laser transmitter in the related art. A semiconductor laser 70 (LD: laser diode) and a monitor photodiode 71 (M-PD) for detecting a light intensity of the semiconductor laser 70 are mounted in a package. An optical signal outputted from the LD 70 is emitted into an optical fiber 73 via a lens 72. Such an optical module is structurally called a coaxial type.

However, the structure of the coaxial type optical module is three-dimensional. Therefore, the three-dimensional structure of the coaxial type optical module makes difficult it to minimize the dimension of the structure and reduce the production process.

In order to solve this problem, a surf ace packaging technique has been developed such that LD and M-PD or a photodiode (PD) and a pre-amplifier (PRE-AMP) are packaged on a substrate. The steps of manufacturing the optical module by using the above-described surface packaging technique are described by reference to FIGS. 8 to 10. FIG. 8 is a plan view of a lead frame in the related art. FIG. 9 is a flowchart showing a process of manufacturing the optical module. FIG. 10 is a diagram showing a method for manufacturing the optical module.

Here, a lead frame 80 is plated on a copper plate with Ni and Au. The copper plate is 200 $\mu$m thickness. As shown FIG. 8, the lead frame 80 is provided with frame 81, die pad 82, leads 83, and connection leads 84. The die pads 82 are coupled to the lead frame 80 via leads 83, and each leads 83 are coupled by connection leads 84.

An optical module using the lead frame 80 is manufactured through the steps as shown in FIGS. 9 and 10.

First, a Si platform 20 is formed with a V-shaped groove for securely holding an optical fiber 30 and an electrode pattern for soldering LD 21 and an M-PD 22.

The LD 21 and the M-PD 22 are soldered to the Si platform 20. And then, the optical fiber 30 is fixed with resin to the Si plat form. At this time, the optical fiber 30 is put in between a glass plate 40 and the Si platform 20. This intermediate product in this condition is called a sub-module.

After the sub-module is fixed on the die pad 82 of the lead frame 80, the sub-module is connected to the leads 83 by wire bonding and then the sub-module is encapsulated with resin 50 by using a transfer molding technique.

Further, the connection leads 84 and the frame 81 are cut away to electrically insulate leads 83 with one another. And then, portions of the leads 83 extended from the package are bent to form in a predetermined angle.

When the sub-module is processed as described-above, electricity can flow through the LD and the M-PD for a screening test of the sub-module. In the screening test of the sub-module, a current flows through the LD in a high-temperature environment or applying a reverse bias voltage to the sub-module. The quality of the LD depends on the changing rate of a threshold current sensitive to stress. Further, the quality of the M-PD depends on the rate of change of a leakage current. The sub-module is finally examined after the screening test.

Therefore, the Optical fiber, the glass plate, the resin for molding, and a cost of all process including the molding process are wasted in the related art, when the defective LD and M-PD of the sub-module are found by the screening test. Therefore, in the related art, the yield of the products depends on the yields of the LD and M-PD, so that a total cost of the products is increased. When the defective LD and M-PD is found by the screening test which is carried out after the molding process, the optical fiber with ferrule has to be discarded, thereby the cost of the products are increased owing to the discarded optical fiber with ferrule.

SUMMARY OF THE INVENTION

It is an object of the invention to provide a lead frame structure, which permits screening test to be performed at a pre-processing step and a drastic cost reduction, and to provide an optical module using the lead frame structure or a producing method of the optical module.

In the invention, leads in the lead frame are electrically insulated with regard to one another. More specifically, a lead frame has a plurality of leads, a die pad, and a plurality of connection leads connecting the leads.

Further, the connection leads are formed of an insulating material, and the connection leads electrically insulate the leads with one another.

Heretofore, when the connection leads and the leads are formed of the same metallic material and the leads electrically conducts with one another, it is difficult to perform screening test that current flows through each LD and each M-PD prior to resin molding. According to the invention, when the connection leads are formed of insulating material to electrically insulate leads with regard to one another, the screening test can be carried out even before packaging or encapsulating by the resin molding.

Consequently, the waste of the component elements of the leads frame can be eliminated and the cost of the products can be reduced.

The material of the connection leads may not be restrictive as long as the material has insulating property and is excellent in producibility. The connection leads are preferably formed of thermoplastic resin since the thermoplastic which is excellent in producibility can be hardened in a short time. Particularly, the connection leads are preferably formed of liquid crystal polymer. The connection leads is removed at the post-processing stage, the liquid crystal polymer is suitably adaptable and easily removable.

Such lead frames can be utilize for semiconductor integrated circuits such as LSI and optical modules. In the semiconductor integrated circuit, a semiconductor chip is mounted on a die pad in a lead frame. In the optical module, an optical communication functional portion is mounted on a die pad.

The optical communication functional portion preferably includes an optical transmission member and at least one of a light receiving element and a light emitting element. The optical transmission member may be an optical fiber or an optical waveguide. As the optical communication functional portion, there may be enumerated a transmitter or a receiver or a transceiver for optical communication. For example, an optical transmitter having built-in LD and M-PD and an optical receiver having built-in PD and PRE-AMP are formed on one substrate by using the surface packaging technique.

When the surface packaging is performed, the optical communication functional portion is preferably formed on Si substrate or a ceramic substrate. The Si substrate can be used in the surface packaging of the invention because Si is easily etched to form a V-shaped groove. Further, the ceramic substrate can be used in the surface packaging of invention because ceramics such as alumina has great hardness to thereby perform the surface packaging in high precision.

The optical communication functional portion is sealed in a plastic package or by a transfer molding. When the optical communication functional portion is sealed in the plastic package, the optical communication functional portion is fitted into a preformed package. When the optical communication functional portion is sealed by the transfer molding, the optical communication functional portion is encapsulated with a resin. Further, the sealed optical communication functional portion by transfer molding may be sealed in the plastic packaging.

In the invention, a method for producing an optical module having a lead frame and optical communication functional portion, comprising:

performing a screening test of the optical functional portion;

mounting the optical functional portion on the die pad of the lead frame after the screening test; and packaging the optical module selected by the screening test.

when electronic and optical devices are directly sealed in the lead frame including insulated leads or the electronic and the optical devices are indirectly packaged through a platform in the lead frame including the insulated leads, inspection and screening test of the packaged electronic and optical devices are performed before packaging or molding.

Thus, the waste of the leads frame can be eliminated by performing the screening test, which is performed before the packaging, so that the cost of products is drastically reduced.

It is preferable that the optical communication functional portion is mounted on the substrate after the screening test which is performed without disposing the optical transmission member in a disposing step of the optical communication functional portion, since the optical transmission member with the ferrule is particularly expensive in the component elements for the optical communication functional portion.

Conventionally, since the screening test is heretofore performed after the packaging, all of the optical transmission member such as optical fibers have to be unavoidably discarded in case that the optical transmission member is found to be poor in quality through the screening test. However, when the screening test is performed before the optical transmission member is packaged, the waste of such optical transmission member as well as a packaging material is eliminated to thereby improve the yield of the products. Therefore, the total cost of the products is drastically reduced.

BRIEF DESCRIPTION OF THE DRAWINGS

FIG. 7 is a cutaway perspective view showing a conventional optical module;

FIG. 8 is a plan view of a conventional lead frame;

FIG. 9 is a flowchart showing a producing method the conventional optical module; and FIG. 10 is a diagram showing the producing method the conventional optical module.

PREFERRED EMBODIMENTS OF THE INVENTION

In the following, the embodiments of the invention will be explained.

(Embodiment 1)

Figure 1:
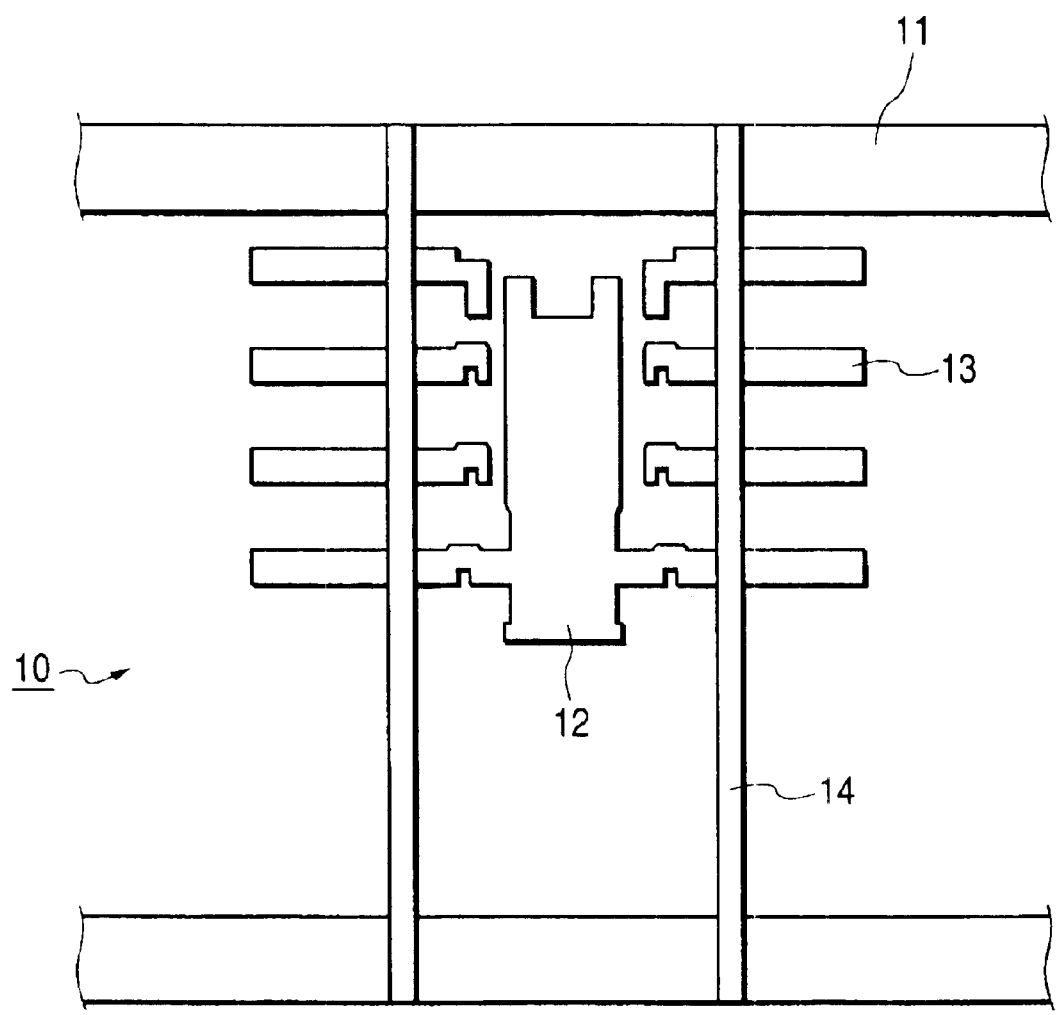
FIG. 1 is a plan view showing a lead frame according to the invention.

As shown in FIG. 1, a lead frame 10 includes a pair of linear frames 11 and a die pad 12 provided therebetween, leads 13 and connection leads 14.

Each lead 13 has a long, narrow plate-like shape and is coupled to the connection leads 14. The die pad 12 has a substantially rectangular plate-like shape and is coupled to the pair of the leads 13. Here, the frame 11, the die pad 12, and the leads 13 are made of metal as in the related art, but the connection leads 14 are made of an insulating material. In the first embodiment, the connection leads 14 are made of a liquid crystal polymer. Moreover, the frames 11 are not frame-like in shape as well as in the related art, but linear in shape. Further, the frames 11 are mounted in parallel to each other. Each lead 13 is connected to the frames 11 only via the connection lead 14 to thereby keep electrically insulated with the frame 11.

The lead frame of the first embodiment is manufactured as follows.

Figure 2:
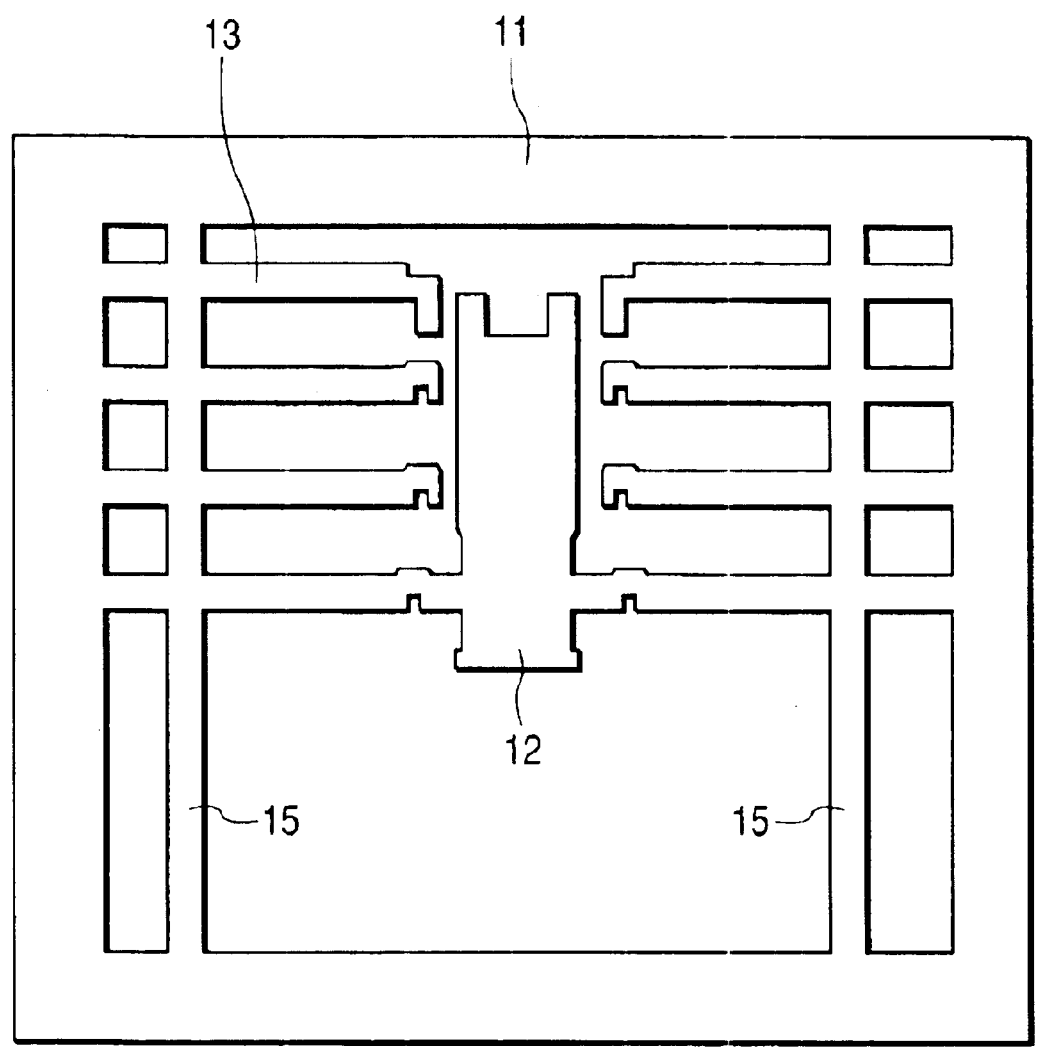
FIG. 2 is a plan view showing a metallic lead frame at the prior stage at which the lead frame of FIG. 1 is made.
Figure 3:
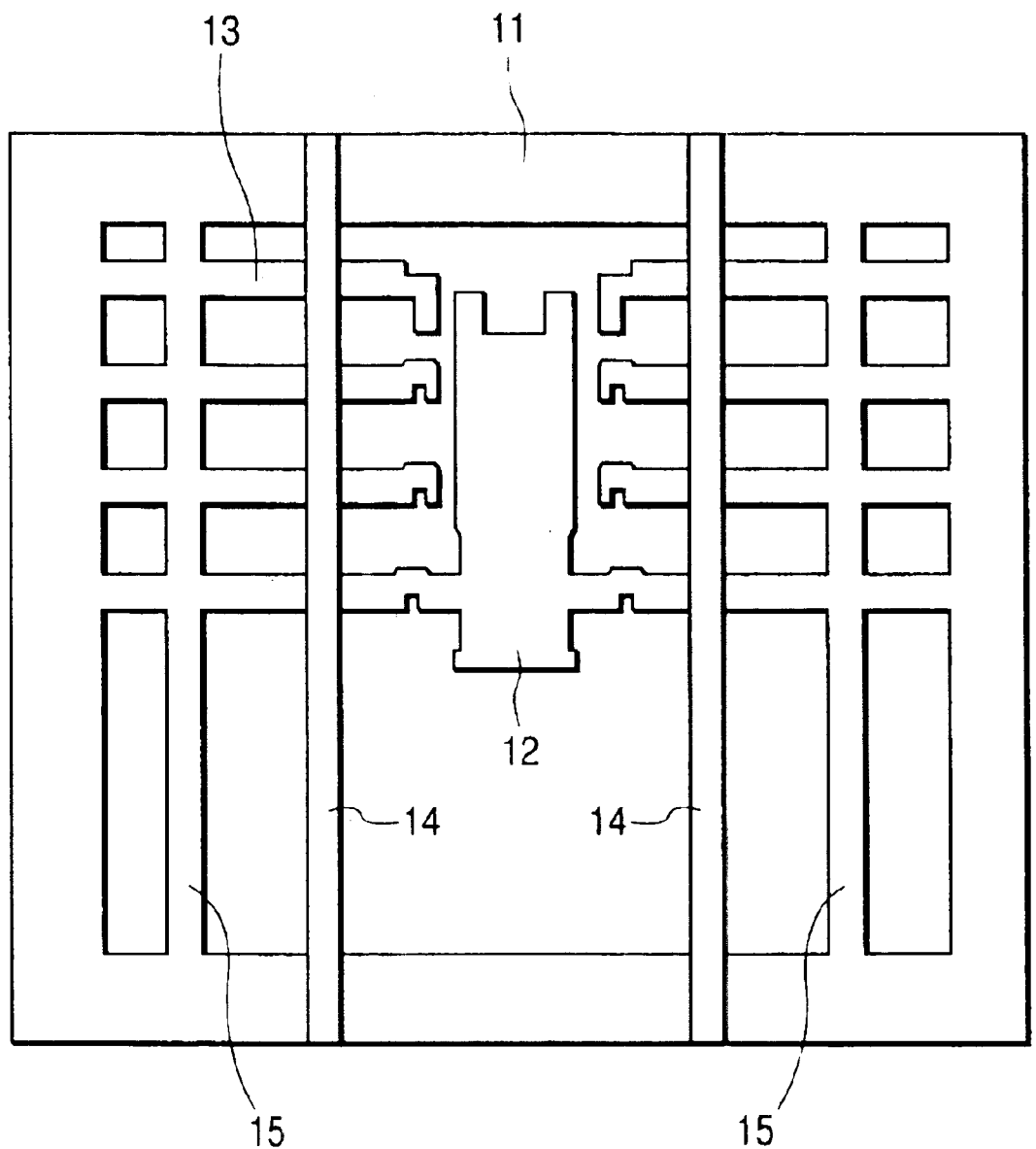
FIG. 3 is a plan view showing the lead frame in which insulating connection leads are formed.

As shown in FIG. 2, a metallic lead frame is formed integrally with a frame 11, a die pad 12, leads 13, and a metallic connection leads 15 which are made of metal. As shown in FIG. 3, the insulating connection leads 14 are formed by a metal-molding method between the die pad 12 and the metallic connection leads 13, and then the insulating connection leads are connected to the connection leads 13. Finally, a lead frame 10 with the insulating connection leads as shown in FIG. 1 is obtained by cutting away the metallic connection leads 15 and both sides of the frame 11.

Figure 4:
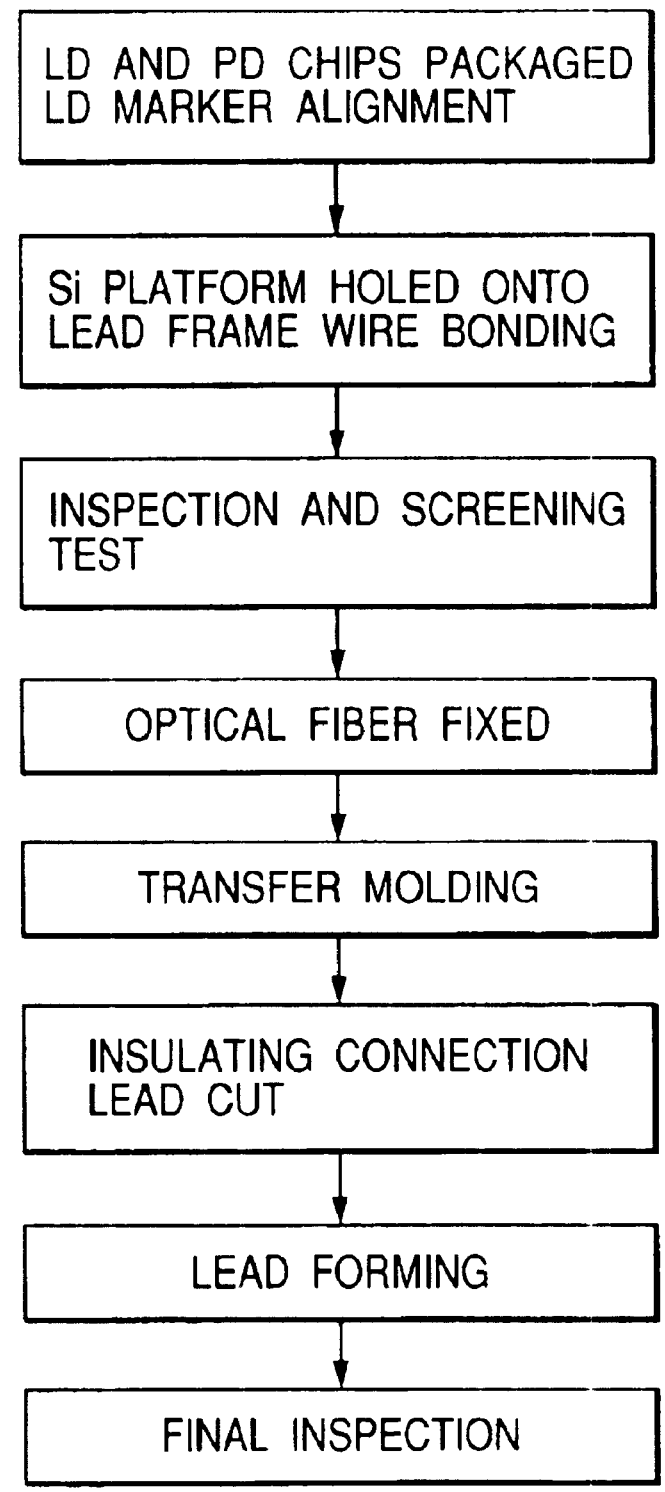
FIG. 4 is a flowchart showing a producing method of an optical module according to the invention.
Figure 5:
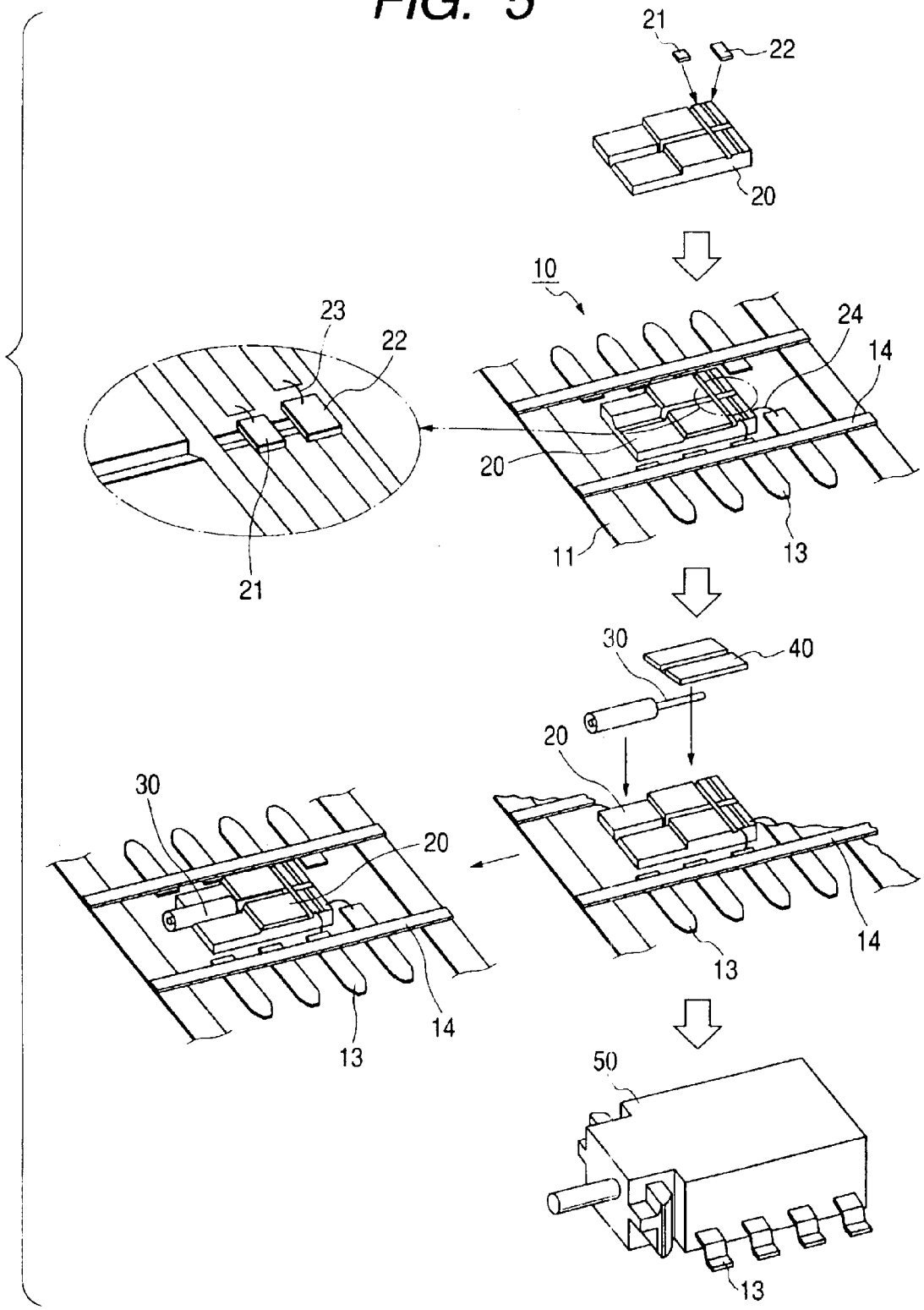
FIG. 5 is a diagram showing the producing method of the optical module according to the invention.

With reference to FIGS. 4 and 5, the process of manufacturing an optical module using the lead frame 10. FIG. 4 is a flowchart illustrating the steps of manufacturing the optical module. FIG. 5 shows a method of manufacturing the same.

(1) A Si platform 20 (e.g., an Si (100) substrate 3 mm (Length)×1.5 mm (Width)×1.2 mm (Thickness) in size) formed with the V-shaped groove for securely holding the optical fiber and an Au—Cr metallized pattern for LD and M-PD is prepared.

An LD chip 21 (300 $\mu$m (Length)×300 $\mu$m (Width)×120 $\mu$m (thickness)) with InGaAsP as a light emitting layer and an M-PD chip 22 (450 $\mu$m (Length)×450 $\mu$m (Width)×120 $\mu$m (Thickness) with InGaAs as a light receiving layer are soldered onto the Si platform 20 with AuSn and SnPb.

Electrodes on the upper surface of the LD chip 21 and the wiring pattern of the Si platform 20 are connected together by wire bonding used by AU lines 23 (a diameter: about 20 to 30 μcm). Electrodes on the upper surface of the PD chip 22 and the wiring pattern of the Si platform 20 are also connected together by the wire bonding. At this step, the expensive optical fiber is not attached yet.

(2) Then, the Si platform 20 is packaged on the die pad mounted on the lead frame 10 shown in FIG. 1. In other words, the wiring pattern of the Si platform 20 and the lead 13 are connected via an Au line 24.

(3) A screening test of the packaged Si platform is performed at this step. First, a characteristic inspection of the packaged Si platform is made before the screening test so as to exclude LD chip 21 having insufficient power or emitting no light and M-PD chip having a high dark current.

Then, the screening test performs the packaged Si platform judged as good quality by the characteristic inspection. When the screening test is performed, in a high-temperature bath of, for example, 85° C., a forward current ranged from 100 mA to 200 mA (which is varied with the kind of the product) is applied to the LDs and a backward voltage from −15V to −30V (also varied with the kind of the product) is applied to the M-PDs. The time flowing electricity varies with the kind of the product and is ranged from several hours to tens of hours.

After the LDs and M-PDs are taken out of the high-temperature bath, the characteristics of the LDs and M-PDs are examined again and the relations between the light-emitting power and the driving current thereof are measured by means of a large-caliber power meter in order to study variations of the threshold current in detail. For the M-PDs, a high sensitive current meter measures variations of the dark current most sensitive to stress. When either the LD or M-PD having a greater characteristic fluctuation is regarded as poor in quality, the poor LD or M-PD in quality is removed at this stage.

As shown in FIG. 8, the leads 83 are positioned by the metallic connection leads 84, so that the lead frame of the related art is not electrically insulated. Therefore, current cannot flow through each of the LD and M-PD.

On the contrary, according to the invention, the connection leads 14 are made of insulating material and the leads 13 are electrically insulated in the lead frame 10. Therefore, the screening test that current flows through each of the LD and M-PD respectively is performed.

(4) The optical fiber 30 is fixed to only the lead frame judged to be good in quality in such a manner that the optical fiber is arranged in the V-shaped groove of the packaged Si platform and then sealed with the glass plate 40 from the above.

(5) The optical fiber 30 is encapsulated with a resin by transfer molding. Then, the insulating connection leads 14 are cut away from the leads frame. And then, after the form of the leads 13, the packaged Si platform is to be a product.

(6) Finally, the product is subjected to delivery inspection (final inspection). In this case, the product is coupled to the optical fiber to thereby examine the final optical output power.

When the detective product is found out by performing the screening test after encapsulating or packaging, the material cost of the optical fiber and the processing cost of the mold have heretofore been uselessly wasted. However, a detective product can be removed beforehand by performing the screening test before encapsulating or packaging, whereby these costs can be saved according to the invention and a greater cost reduction can be achieved.

(Embodiment 2)

Figure 6:
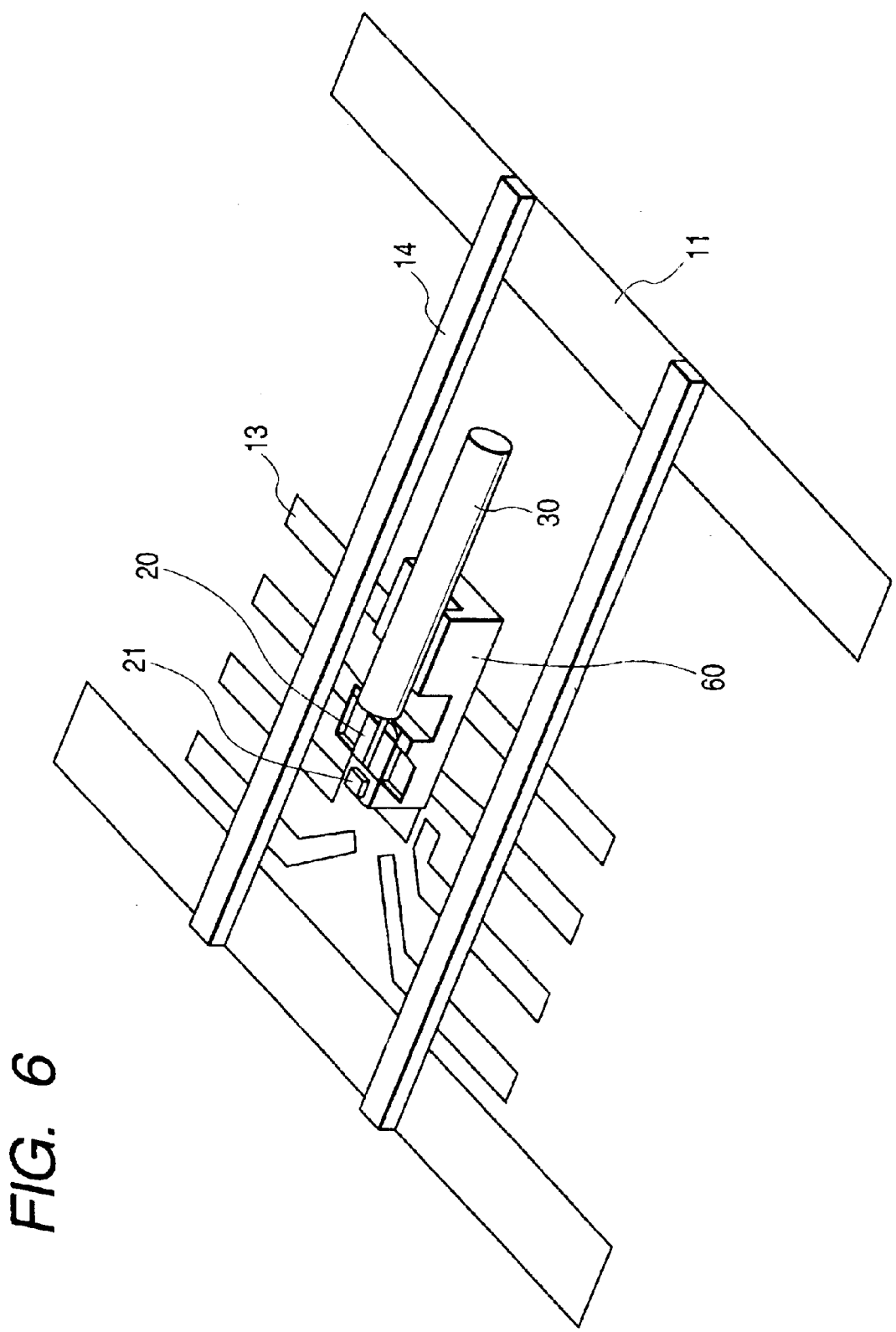
FIG. 6 is a schematic perspective view showing an optical module of the invention whose a substrate for fixing an optical fiber is formed of liquid crystal polymer.

An optical module according to the invention slightly different in constitution from the first embodiment will be described with reference to FIG. 6.

Only the LD 21 is packaged on the Si platform 20 in this case and then a substrate 60 for securely holding the Si platform 20. Further, the substrate 60 is made of liquid crystal polymer so as to decrease the size of the Si platform 20 whereby to attempt a cost reduction.

According to the second embodiment, the Si platform 20 with the LD 21 is packaged on the substrate 60. And then, the screening test of the packaged Si platform 20 with the LD 21 is performed before the optical fiber 30 is attached thereto. Then, the optical fiber 30 is fixed to the substrate 60 with resin and further encapsulated with resin by transfer molding.

A detective product can be removed beforehand in the second embodiment as well as in first embodiment by performing the screening test before the optical fiber is fixed to the substrate with resin, so that a product cost is drastically reduced.

Although first and second embodiments are explained as optical modules, the same effect is also achievable from an optical transmitter, an optical receiver, and an optical transceiver which is combined the optical transmitter and the optical receiver for optical communication. Moreover, the Si platform 20 may be formed of not only Si but also ceramic material such as $Al_2O_3$. The semiconductor integrated circuit and the optical module are most suitable for effectively utilizing the lead frame for the purpose of the invention.

What is claimed is:

1. An optical module comprising;
   a lead frame including the leads, a die pad, and a connection lead being connected with the leads,
   wherein the connection lead are formed of an insulating material, and the connection lead electrically insulates the leads with one another; and
   an optical communication functional portion mounted on the die pad of the lead frame.

2. The optical module according to claim 1, wherein the optical communication functional portion has an optical transmission member and at least one of a light receiving element and a light emitting element.

3. The optical module according to claim 2, wherein the optical transmission member is an optical fiber.

4. The optical module according to claim 2, wherein the optical transmission member is an optical waveguide.

5. The optical module according to claim 1, wherein the optical communication functional portions on the die pad is mounted on a Si substrate.

6. The optical module according to claim 1, wherein the optical communication functional portions on the die pad is mounted on a ceramic substrate.

7. The optical module according to claim 1, wherein the optical communication functional portion is sealed with a plastic package.

8. The optical module according to claim 1, wherein the optical communication functional portion is encapsulated with a resin by a transfer molding.

* * * * *